(12) United States Patent
Chuang et al.

(10) Patent No.: US 9,570,539 B2
(45) Date of Patent: Feb. 14, 2017

(54) INTEGRATION TECHNIQUES FOR MIM OR MIP CAPACITORS WITH FLASH MEMORY AND/OR HIGH-κ METAL GATE CMOS TECHNOLOGY

(71) Applicant: Taiwan Semiconductor Manufacturing Co., Ltd., Hsin-Chu (TW)

(72) Inventors: Harry-Hak-Lay Chuang, Zhubei (TW); Yu-Hsiung Wang, Zhubei (TW); Chen-Chin Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/851,357

(22) Filed: Sep. 11, 2015

(65) Prior Publication Data
US 2016/0225846 A1   Aug. 4, 2016

Related U.S. Application Data

(60) Provisional application No. 62/110,002, filed on Jan. 30, 2015.

(51) Int. Cl.
*H01L 27/108* (2006.01)
*H01L 49/02* (2006.01)
*H01L 27/115* (2006.01)

(52) U.S. Cl.
CPC ......... *H01L 28/90* (2013.01); *H01L 27/10805* (2013.01); *H01L 27/1157* (2013.01)

(58) Field of Classification Search
CPC ............. H01L 28/40; H01L 27/0629; H01L 27/10829; H01L 27/10805; H01L 27/1052; H01L 27/105; H01L 27/10861
USPC .................. 257/296, 306, 309, 313
See application file for complete search history.

(56) References Cited

U.S. PATENT DOCUMENTS

| | | | | |
|---|---|---|---|---|
| 6,303,455 B1 * | 10/2001 | Hou | ........................ | H01L 28/40 257/E21.008 |
| 6,674,118 B2 | 1/2004 | Yeh et al. | | |
| 6,869,835 B2 * | 3/2005 | Kim | .................. | H01L 21/82346 257/E21.008 |
| 6,956,261 B2 * | 10/2005 | Shibata | ............. | H01L 27/10894 257/303 |
| 7,011,999 B2 * | 3/2006 | Minami | .............. | H01L 27/0629 257/E21.004 |

(Continued)

*Primary Examiner* — Earl Taylor
(74) *Attorney, Agent, or Firm* — Eschweiler & Associates, LLC

(57) ABSTRACT

Some embodiments of the present disclosure relate to an integrated circuit (IC) arranged on a semiconductor substrate, which includes a flash region, a capacitor region, and a logic region. An upper substrate surface of the capacitor region is recessed relative to respective upper substrate surfaces of the flash and logic regions, respectively. A capacitor, which includes a polysilicon bottom electrode, a conductive top electrode arranged over the polysilicon bottom electrode, and a capacitor dielectric separating the bottom and top electrodes; is disposed over the recessed upper substrate surface of the capacitor region. A flash memory cell is disposed over the upper substrate surface of the flash region. The flash memory cell includes a select gate having a planarized upper surface that is co-planar with a planarized upper surface of the top electrode of the capacitor.

20 Claims, 10 Drawing Sheets

(56) References Cited

U.S. PATENT DOCUMENTS

| | | | | |
|---|---|---|---|---|
| 7,018,890 B2* | 3/2006 | Tamura | H01L 27/11526 | 257/E21.679 |
| 7,141,469 B2* | 11/2006 | Kao | H01L 28/60 | 257/E21.011 |
| 7,208,364 B2* | 4/2007 | Pan | H01L 27/0629 | 257/E21.427 |
| 7,371,632 B2* | 5/2008 | Ko | H01L 27/0629 | 257/E21.008 |
| 7,517,752 B2* | 4/2009 | Shin | H01L 21/82346 | 257/310 |
| 7,968,924 B2* | 6/2011 | Sato | H01L 27/105 | 257/296 |
| 8,039,355 B2 | 10/2011 | Lee | | |
| 8,138,537 B2* | 3/2012 | Sato | H01L 27/105 | 257/296 |
| 8,373,216 B2* | 2/2013 | Chakihara | H01L 21/28273 | 257/298 |
| 8,896,053 B2* | 11/2014 | Chakihara | H01L 21/28273 | 257/314 |
| 2002/0142540 A1* | 10/2002 | Katayama | H01L 28/60 | 438/239 |
| 2003/0080366 A1* | 5/2003 | Tamura | H01L 27/11526 | 257/298 |
| 2004/0207004 A1* | 10/2004 | Tamura | H01L 27/11526 | 257/315 |
| 2005/0085046 A1* | 4/2005 | Kao | H01L 28/60 | 438/396 |
| 2005/0124133 A1 | 6/2005 | Tu | | |
| 2006/0145251 A1* | 7/2006 | Ko | H01L 27/0629 | 257/337 |
| 2007/0249166 A1* | 10/2007 | Pelella | H01L 21/84 | 438/689 |
| 2007/0269972 A1* | 11/2007 | Kawashima | H01L 21/28282 | 438/597 |
| 2008/0191259 A1* | 8/2008 | Ko | H01L 27/0629 | 257/306 |
| 2009/0090948 A1* | 4/2009 | Sato | H01L 27/105 | 257/296 |
| 2009/0194844 A1* | 8/2009 | Richter | H01L 21/743 | 257/532 |
| 2010/0078695 A1* | 4/2010 | Law | H01L 23/5223 | 257/296 |
| 2010/0289120 A1* | 11/2010 | Sato | H01L 27/105 | 257/534 |
| 2010/0320521 A1* | 12/2010 | Izumi | H01L 27/10814 | 257/306 |
| 2011/0095348 A1* | 4/2011 | Chakihara | H01L 21/28273 | 257/298 |
| 2013/0126960 A1* | 5/2013 | Chakihara | H01L 21/28273 | 257/324 |
| 2015/0054045 A1* | 2/2015 | Chakihara | H01L 21/28273 | 257/314 |
| 2015/0060971 A1* | 3/2015 | Fujii | H01L 27/11529 | 257/300 |

* cited by examiner

INTEGRATION TECHNIQUES FOR MIM OR MIP CAPACITORS WITH FLASH MEMORY AND/OR HIGH-κ METAL GATE CMOS TECHNOLOGY

REFERENCES TO RELATED APPLICATIONS

The present application claims priority to U.S. provisional application filed on Jan. 30, 2015, which has an Application No. 62/110,002 and is entitled "HIGH CAPACITANCE AND/OR HIGH VOLTAGE CAPACITOR TECHNIQUES TO INTEGRATE WITH HIGH-k METAL GATE CMOS TECHNOLOGY", the contents of which are incorporated herein in their entirety.

BACKGROUND

The semiconductor manufacturing industry has experienced exponential growth over the last few decades. In the course of semiconductor evolution, the minimum feature sizes for semiconductor devices has decreased over time, thereby helping to increase the number of semiconductor devices per unit area on successive generations of integrated circuits (ICs). This device "shrinkage" allows engineers to pack more devices and more corresponding functionality onto newer generations of ICs, and is consequently one of the underlying drivers of the modern digital age. Another advancement that has helped improve the functionality of ICs has been to replace traditional polysilicon gates with metal gates, and to replace traditional silicon dioxide gate dielectrics with so called high-κ dielectrics. Whereas silicon dioxide has a dielectric constant of approximately 3.9, high-κ dielectrics have a dielectric constant of more than 3.9, which helps to reduce gate leakage and allows faster switching for transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
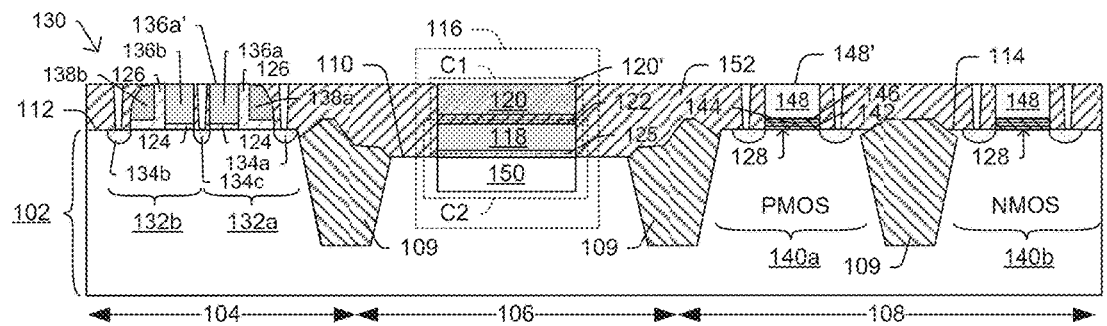
FIG. 1 illustrates a cross-sectional view of an integrated circuit (IC), which includes a flash memory cell, polysilicon-insulator-polysilicon (PIP) or polysilicon-insulator-metal (PIM) capacitor, and HKMG transistor integrated thereon in accordance with some embodiments.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different types of semiconductor devices onto a single integrated circuit (IC). Such integration can advantageously lower manufacturing costs, simplify manufacturing procedures, and increase performance of the final product. Embedded flash memory, which can integrate flash memory cells with other types of semiconductor devices, is one example of a technology where integration is advantageous. Traditional flash memory cells and corresponding logic devices are formed with polysilicon gates insulated by silicon dioxide. As semiconductor feature sizes get smaller, however, the logic devices of such embedded flash memory devices are reaching performance limits. Accordingly, high κ metal gate (HKMG) technology has become one of the front runners for the logic devices in the next generation of embedded flash memory devices. HKMG technology employs a metal gate separated from the underlying substrate by a material with a high dielectric constant κ (relative to silicon dioxide). The high κ dielectric reduces leakage current and increases the maximum drain current, and the metal gate mitigates the effects of Fermi-level pinning and allows the gate to be employed at lower threshold voltages. Further, the high κ dielectric and the metal gate collectively reduce power consumption. Thus, the aim for future generations of embedded flash memory is to integrate flash cells having polysilicon gates with HKMG logic devices.

Recent attempts to form such embedded flash memory devices have suffered from shortcomings. For example, one recent challenge arises from the fact that embedded flash memory devices and HKMG technology has been incompatible with polysilicon-insulator-polysilicon (PIP) and polysilicon-insulator-metal (PIM) capacitor technologies until now. In particular, this incompatibility has stemmed from a lack of sufficient height or thickness to form the PIP/PIM capacitor because of the processing techniques used for flash and HKMG. For example, in a traditional HKMG replacement gate process (RPG), a chemical mechanical polishing (CMP) operation usually planarizes all features to a height corresponding to an upper surface of a sacrificial polysilicon gate of the logic device. This CMP process would result in a PIP or PIM capacitor being squeezed too thin vertically, such that there is insufficient vertical space to provide upper and lower capacitor electrodes which are separated from one another by a capacitor dielectric in a reliable manner.

Accordingly, the present disclosure is directed to improved methods of semiconductor manufacturing wherein a capacitor region of the substrate over which a PIP or PIM capacitor is to be formed is recessed relative to flash and HKMG regions. This allows an increased overall height or thickness for the PIP or PIM capacitors when such capacitors are integrated on chip with flash and HKMG circuits.

Figure 2:
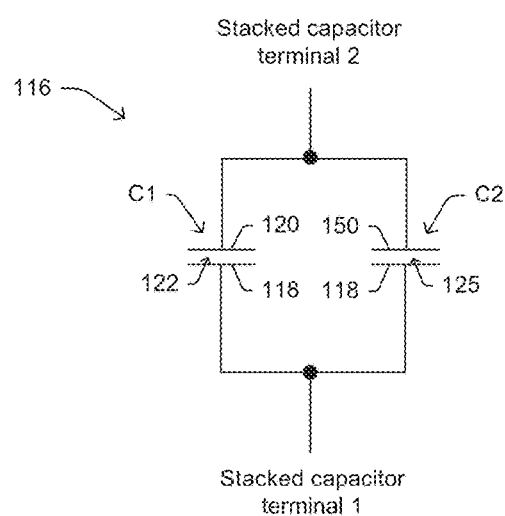
FIG. 2 illustrates some embodiments of a schematic representation of the PIP or PIM capacitor consistent with FIG. 1.

FIG. 1 illustrates a cross sectional image of an integrated circuit (IC) 100, which is disposed on a semiconductor substrate 102. The substrate 102 includes a flash region 104, a capacitor region 106, and a logic region 108, which are isolated from one another by shallow trench isolation (STI) regions 109. An upper substrate surface of the capacitor region (110) is recessed relative to respective upper substrate surfaces of the flash and logic regions (112, 114), respectively. A capacitor 116 is disposed over the recessed upper substrate surface 110. The capacitor 116 is made up of a first capacitor, C1, and a second capacitor, C2, which are stacked in parallel, and thus, can in some regards double the capacitance per unit area compared to non-stacked approaches. The first capacitor, C1, includes bottom electrode 118 and top electrode 120, wherein a first capacitor dielectric 122 separates the bottom and top electrodes 118, 120. The second capacitor, C2, includes bottom electrode 118 and doped substrate region 150, wherein a second capacitor dielectric 125 separates the bottom electrode 118 and doped substrate region 150. As shown by the schematic of FIG. 2, the top electrode 120 is ohmically coupled to the doped region 150 such that the first and second capacitors C1, C2 are arranged in parallel with one another. For example, one or more contacts (not shown) can extend vertically between the top electrode 120 and doped substrate 150 to ohmically couple the top electrode 120 to the doped region 150.

As will be appreciated in greater detail further herein, capacitor 116 can take various forms depending on the implementation. The bottom electrode 118 is typically polysilicon, but the top electrode 120 can manifest as doped polysilicon (resulting in capacitor 116 being a PIP capacitor) or can manifest as metal (resulting in capacitor 116 being a PIM capacitor). The first capacitor dielectric 122 can manifest as $SiO_2$, which corresponds to a gate oxide 124 of a pair of split gate flash memory cells in flash region 104; or can correspond to a charge trapping dielectric 126 of the pair of split flash gate cells; or can correspond to a high-κ dielectric 128 of the PMOS and/or NMOS HKMG logic transistors in logic region 108. The second capacitor dielectric 125 can manifest as $SiO_2$, which corresponds to a gate oxide 124 of a pair of split gate flash memory cells in flash region 104, or can correspond to a charge trapping dielectric 126 of the pair of split flash gate cells.

Notably, a planarized upper surface of the capacitor top electrode (120') is co-planar with a planarized top surface of a select gate (e.g., 136a') of a flash memory cell, and is also co-planar with a planarized upper surface of a replacement metal gate (e.g., 148') of the PMOS and/or NMOS HKMG logic transistors. By forming the capacitor 116 on the recessed surface 110, the techniques provided herein allow the capacitor to have a sufficiently large height or thickness such that the bottom electrode 118, top electrode 120, and first and second capacitor dielectrics 122, 125 can operate in a reliable manner.

The illustrated pair of split gate flash cells 130 is made up of a first memory cell 132a and a second memory cell 132b, which are mirror images of one another about an axis of symmetry in some implementations. The pair of split gate flash cells 130 includes two individual source/drain regions 134a, 134b, and a common source/drain region 134c that is shared between the memory cells 132a, 132b. The first and second memory cells include select gates 136a, 136b, respectively and control gates 138a, 138b, respectively, over the cells' respective channel regions. Each select gate and control gate comprises a conductive material, such as a doped polysilicon layer. Gate oxide 124 can typically include $SiO_2$. In some examples, charge trapping dielectric 126 includes a charge trapping silicon nitride layer sandwiched between two silicon dioxide layers to create a three-layer stack collectively and commonly referred to as "ONO." Other charge trapping dielectrics may include a silicon-rich nitride film or a layer of silicon nanoparticle dots, or any film that includes, but is not limited to, silicon, oxygen, and nitrogen in various stoichiometries.

HKMG transistors 140a, 140b are arranged over the logic region 108. In some embodiments, the high-κ dielectric layer 128 includes a bottom high temperature oxide (HTO) layer 142 formed by exposing the substrate to an elevated temperature (e.g., approximately 1000° C.) during a furnace oxidation process. In some embodiments, the thickness of the HTO layer 142 is between approximately 80 angstroms and 200 angstroms, being approximately 180 Angstroms in some embodiments. A high κ dielectric layer 144 is arranged over the HTO layer 142. In some embodiments, the high κ dielectric layer 144 comprises HfO (hafnium oxide), HfSiO (hafnium silicon oxide), HfAlO (hafnium aluminum oxide), or HfTaO (hafnium tantalum oxide). An etch-stop layer (ESL) 146 is arranged over the high-κ dielectric layer 144, and replacement metal gate electrode 148 overlies ESL 146. An interlayer dielectric (ILD) 152, such as a low-κ dielectric layer, overlies the substrate 102.

FIGS. 3-11 provide some example variations of how flash memory, PIP or PIM capacitors, and HKMG circuits can be integrated together on a single semiconductor substrate. It will be appreciated that these examples, like all examples illustrated and/or described herein, are merely non-limiting examples.

Figure 3:
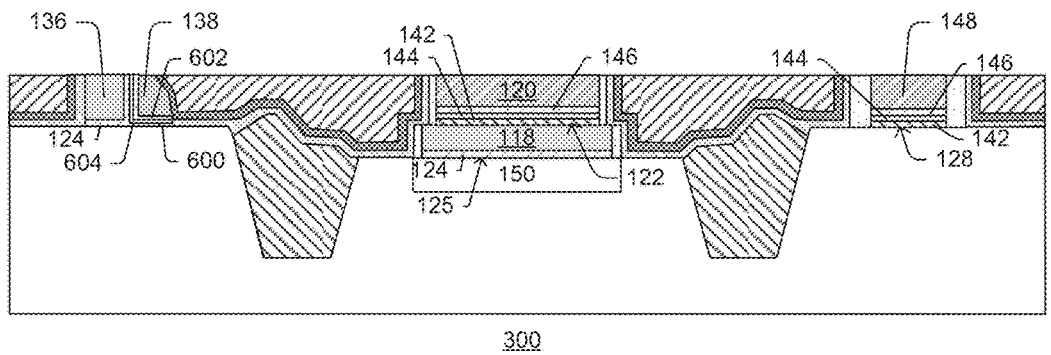
FIGS. 3-11 depict cross-sectional view of ICs that include PIP or PIM capacitors in accordance with some embodiments.

FIG. 3 shows an integrated circuit 300 where the bottom capacitor electrode 118 and the select gate 136 are made of a first polysilicon layer and have the same composition and electrical characteristics as one another. The control gate 138 of the flash memory is made of a second polysilicon layer that can have the same or different composition and/or the same or different electrical characteristics from the first poly layer. The top capacitor electrode 120 and gate electrode 148 of the logic transistor are made of a third polysilicon layer that can have the same or different composition and/or the same or different electrical characteristics from the first and second poly layers. The first capacitor dielectric 122 is the same composition as the logic dielectric 128 (e.g., high-κ dielectric made up of layers 142, 144, 146). The second capacitor dielectric 125 has the same composition as the flash gate dielectric 124, and can be made of an oxide such as $SiO_2$.

Figure 4:
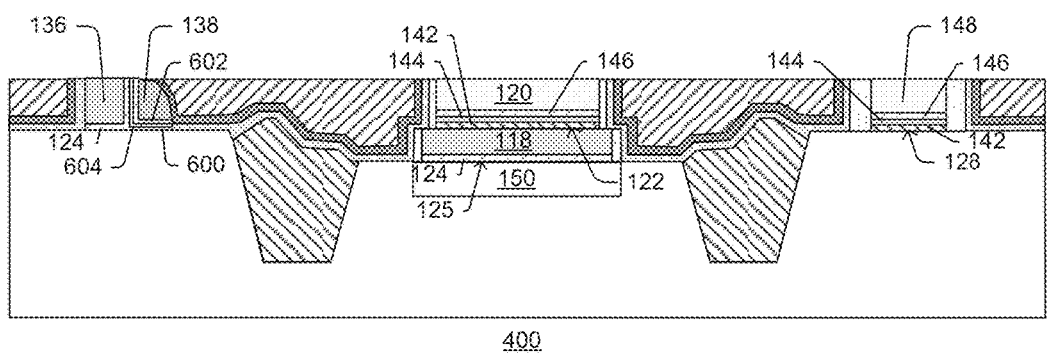

FIG. 4 shows an integrated circuit 400 where the bottom capacitor electrode 118 and the select gate 136 are made of a first polysilicon layer and have the same composition and electrical characteristics as one another. The control gate 138 of the flash memory is a second polysilicon layer that can have the same or different composition and/or the same or different electrical characteristics from the first poly layer. The first capacitor dielectric 122 has the same composition as the logic dielectric 128 (e.g., high-κ dielectric). The top capacitor electrode 120 and the logic transistor electrode 148 are made of a replacement metal gate material, such as aluminum, for example. The second capacitor dielectric 125 has the same composition as the flash gate dielectric 124, and can be made of an oxide such as $SiO_2$.

Figure 5:
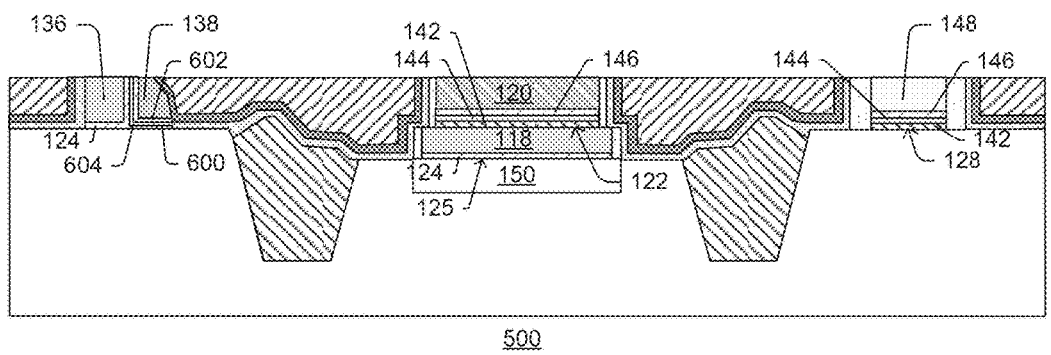

FIG. 5 shows an integrated circuit 500 where the bottom capacitor electrode 118 and the select gate 136 are made of a first polysilicon layer and have the same composition and electrical characteristics as one another. The control gate 138 of the flash memory is a second polysilicon layer that can have the same or different composition and/or the same or different electrical characteristics from the first poly layer. The first capacitor dielectric 122 is the same composition as the logic dielectric 128 (e.g., high-κ dielectric). The top capacitor electrode 120 is a third polysilicon layer, which can be a replacement polysilicon layer that has the same or different composition or the same or different electrical characteristics from the first and/or second poly layers. The logic transistor electrode 148 is made of a replacement metal gate material, such as aluminum, for example. The second capacitor dielectric 125 has the same composition as the flash gate dielectric 124, and can be made of an oxide such as $SiO_2$.

Figure 6:
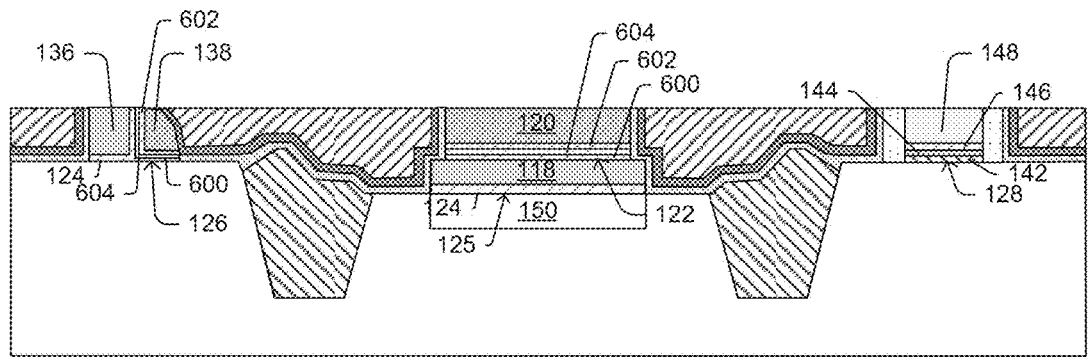

FIG. 6 shows an integrated circuit 600 where the bottom capacitor electrode 118 and the select gate 136 are made of a first polysilicon layer and have the same composition and electrical characteristics as one another. The first capacitor dielectric 122 is a charge trapping layer corresponding to the charge trapping layer 126 used in the flash memory. The charge trapping layer can include first and second oxide layers 600, 602, with a nitride layer or layer of silicon dots 604 sandwiched there between. The capacitor top electrode 120 and control gate 138 are made of a second poly layer, which can have the same or different composition and/or the same or different electrical characteristics as the first poly layer. The logic transistor electrode 148 is made of a replacement metal gate material, such as aluminum for example, and the logic dielectric 128 is a high-κ dielectric. The second capacitor dielectric 125 has the same composition as the flash gate dielectric 124, and can be made of an oxide such as $SiO_2$.

Figure 7:
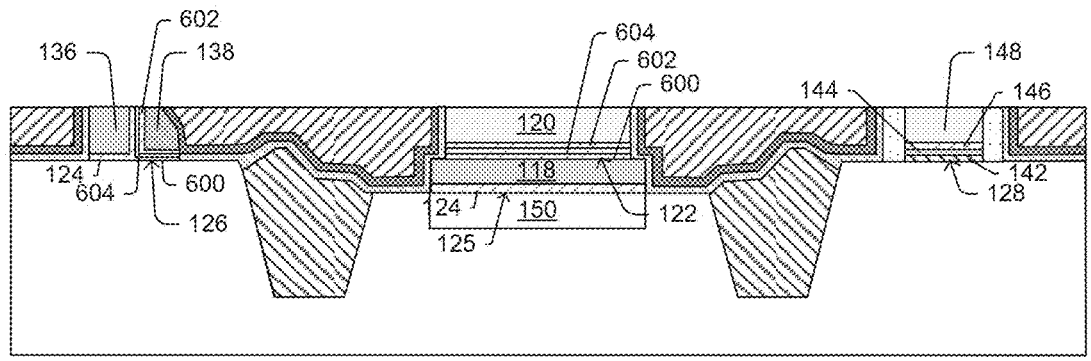

FIG. 7 shows an integrated circuit 700 where the bottom capacitor electrode 118 and the select gate 136 are made of a first polysilicon layer and have the same composition and electrical characteristics as one another. The control gate 138 of the flash memory is made of a second polysilicon layer that can have the same or different composition and/or the same or different electrical characteristics as the first poly layer. The first capacitor dielectric 122 is a charge trapping layer corresponding to the charge trapping layer 126 used in the flash memory. The capacitor top electrode 120 and logic gate electrode 148 are replacement metal structures, and can be made of aluminum for example. The logic dielectric 128 is a high-κ dielectric. The second capacitor dielectric 125 has the same composition as the flash gate dielectric 124, and can be made of an oxide such as $SiO_2$.

Figure 8:
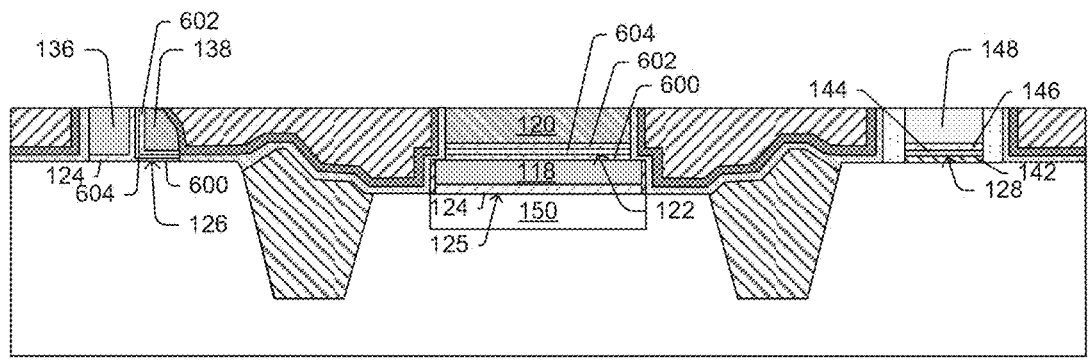

FIG. 8 shows an integrated circuit 800 where the bottom capacitor electrode 118 and the select gate 136 are made of a first polysilicon layer and have the same composition and electrical characteristics as one another. The first capacitor dielectric 122 is a charge trapping layer corresponding to the charge trapping layer 126 used in the flash memory. The capacitor top electrode 120 is made of a third polysilicon layer, such as a replacement polysilicon layer. The logic gate electrode 148 is a replacement metal logic gate electrode, such as aluminum, and the logic dielectric 128 is a high-κ dielectric. The second capacitor dielectric 125 has the same composition as the flash gate dielectric 124, and can be made of an oxide such as $SiO_2$.

Figure 9:
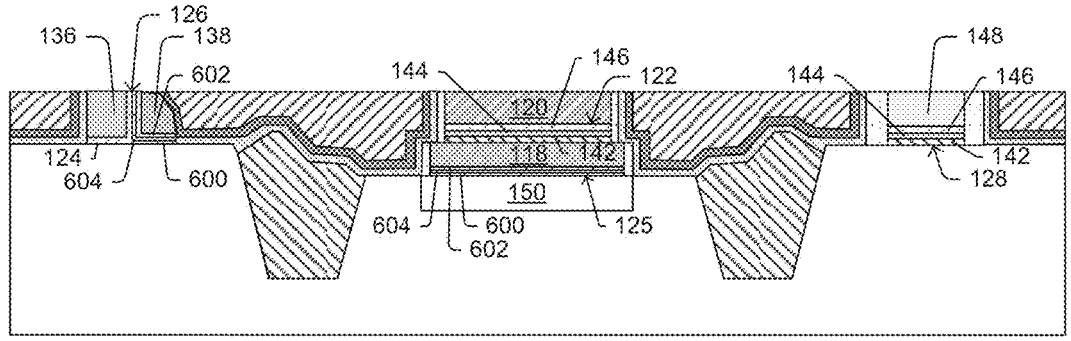

FIG. 9 shows an integrated circuit 900 where select gate 136 is made of a first polysilicon layer. The bottom capacitor electrode 118 and control gate 138 of the flash memory are made of a second polysilicon layer, which can have the same or different composition and/or the same or different electrical characteristics as the first polysilicon layer. The first capacitor dielectric 122 is a high-κ dielectric. The capacitor top electrode 120 is made of a third polysilicon layer, which can have the same or different composition and/or the same or different electrical characteristics as the first or second polysilicon layers. The logic gate electrode 148 is a replacement metal, and the logic dielectric 128 is a high-κ dielectric. The second capacitor dielectric 125 has the same composition as the charge trapping layer 126, and can be made of first and second oxide layers 600, 602, with a charge trapping layer 604 sandwiched there between.

Figure 10:
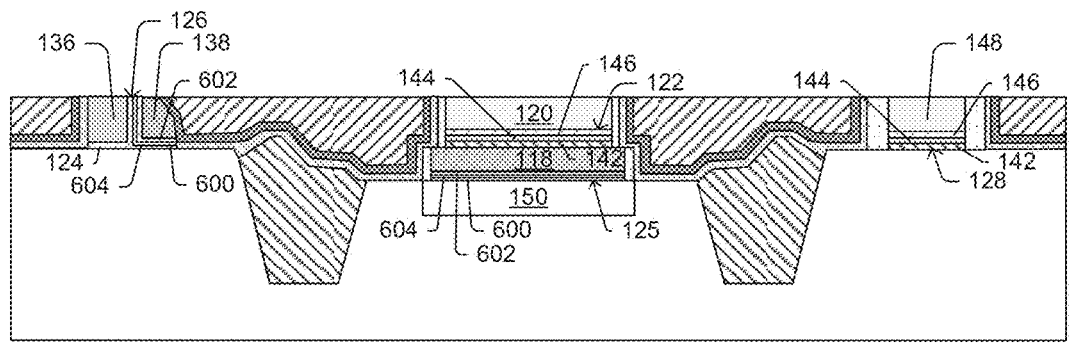

FIG. 10 shows an integrated circuit 1000 where select gate 136 is made of a first polysilicon layer. The bottom capacitor electrode 118 and control gate 138 of the flash memory are made of a second polysilicon layer, which can have the same or different composition and/or the same or different electrical characteristics as the first polysilicon layer. The first capacitor dielectric 122 is a high-κ dielectric. The capacitor top electrode 120 and logic gate electrode 148 are replacement metal structures, and can be made of aluminum for example. The logic dielectric 128 is a high-κ dielectric. The second capacitor dielectric 125 has the same composition as the charge trapping layer 126, and can be made of first and second oxide layers 600, 602, with a charge trapping layer 604 sandwiched there between.

Figure 11:
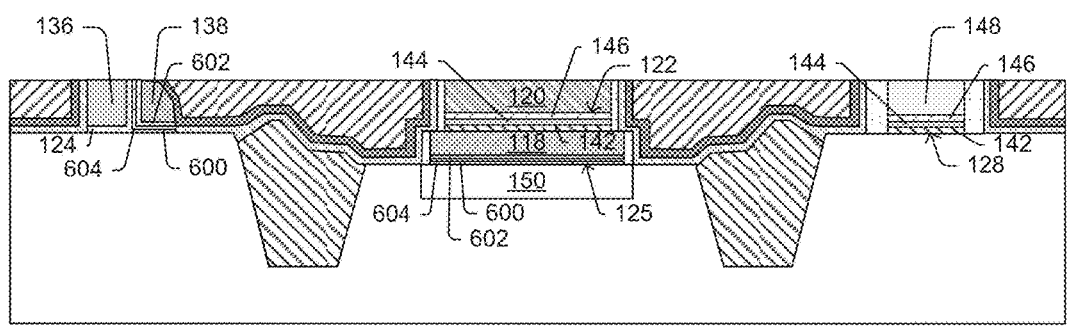

FIG. 11 shows an integrated circuit 1100 where select gate 136 is made of a first polysilicon layer. The bottom capacitor electrode 118 and control gate 120 of the flash memory are made of a second polysilicon layer, which can have the same or different composition and/or the same or different electrical characteristics as the first polysilicon layer. The first capacitor dielectric 122 is a high-κ dielectric. The capacitor top electrode 120 is made of a third polysilicon layer, such as a replacement polysilicon layer. The logic gate electrode 148 is a replacement metal logic gate electrode, such as aluminum, and the logic dielectric 128 is a high-κ dielectric. The second capacitor dielectric 125 has the same composition as the charge trapping layer 126, and can be made of first and second oxide layers 600, 602, with a charge trapping layer 604 sandwiched there between.

Figure 12:
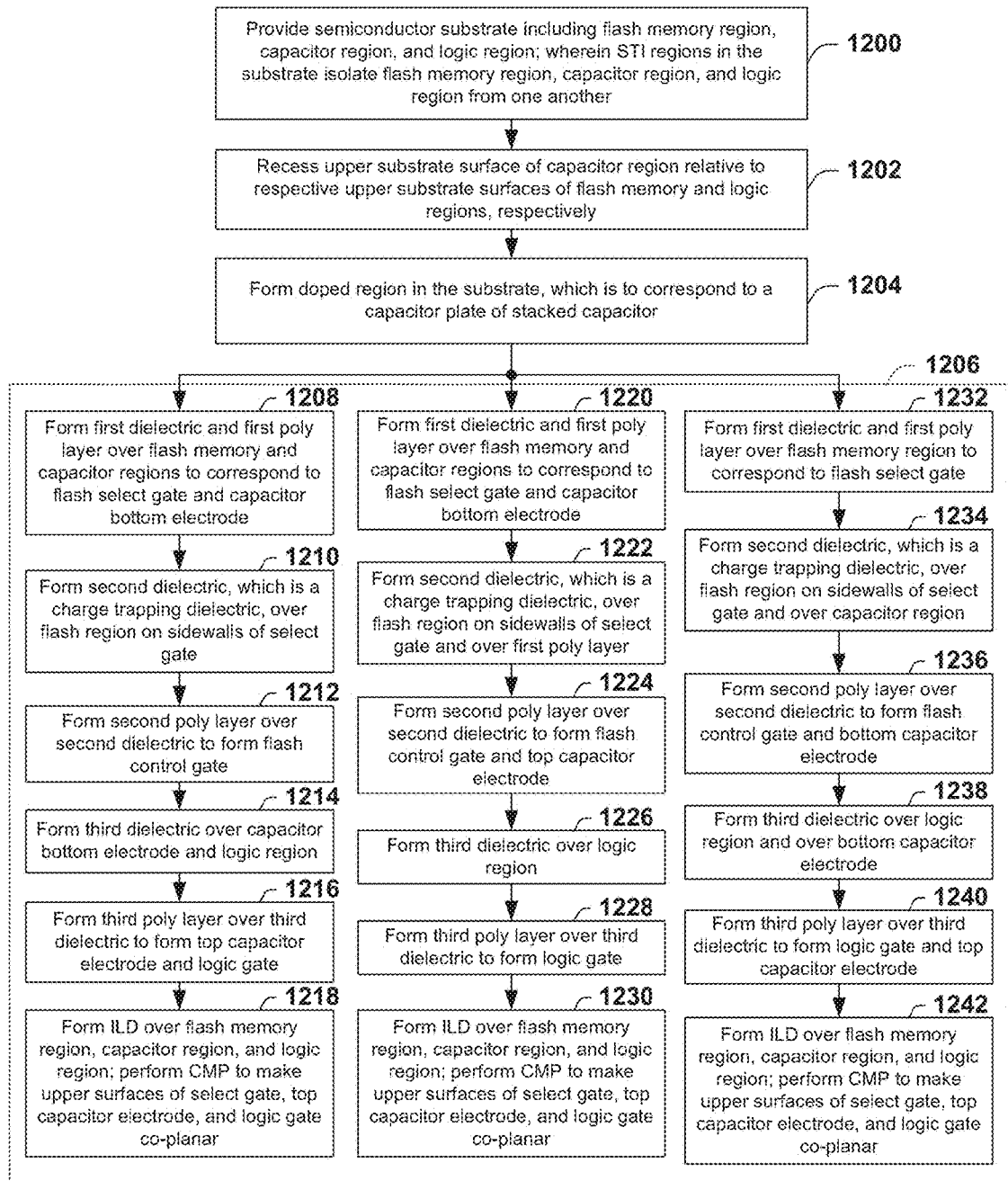
FIG. 12 illustrates a methodology in flow-chart format in accordance with some embodiments.

FIG. 12 illustrates some embodiments of a method of forming an integrated circuit, on which embedded flash memory, a PIP or PIM capacitor, and/or a HKMG logic device are integrated. While the disclosed methods (e.g., the methods described by the flowchart of FIG. 12) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The method starts at 1200, where a semiconductor substrate is provided. The substrate includes a flash memory region, a capacitor region, and a logic region. STI regions in the substrate isolate the flash memory region, the capacitor region, and the logic region from one another.

At 1202, an upper substrate surface of capacitor region is recessed relative to respective upper substrate surfaces of flash memory and logic regions, respectively.

At 1204, a doped region is formed in the capacitor region of the substrate to correspond to a capacitor plate.

Three separate flows to form a flash memory device, HKMG transistor, and PIP or PIM capacitor are illustrated as stemming from 1204. The first flow begins at 1208, where a first dielectric layer and a first poly layer are formed over the flash memory and capacitor regions to correspond to a select gate of flash memory and a capacitor bottom electrode. In 1210, first dielectric and first poly layers are formed over the flash memory and capacitor regions to correspond to a flash select gate and a capacitor bottom electrode. In 1212, a second poly layer is formed over the second dielectric to form a flash control gate. In 1214, a third dielectric is formed over the capacitor bottom electrode and logic region. In 1216, a third poly layer is formed over the third dielectric to establish a top capacitor electrode and logic gate. In 1218, an ILD is formed over flash memory region, capacitor region, and logic region, and CMP is performed to make upper surfaces of select gate, top capacitor electrode, and logic gate co-planar.

The second flow begins at 1220, where a first dielectric layer and first poly layer are formed over flash memory and capacitor regions to correspond to a flash select gate and capacitor bottom electrode. In 1222, a second dielectric, which is a charge trapping dielectric, is formed over the flash region on sidewalls of the select gate and over the first poly layer. In 1224, a second poly layer is formed over the second dielectric to form flash control gate and top capacitor electrode. In 1226, a third dielectric is formed over the logic region. In 1228, a third poly layer is formed over third dielectric to form logic gate. In 1230, an ILD is formed over the flash memory region, capacitor region, and logic region; and CMP is performed to make upper surfaces of select gate, top capacitor electrode, and logic gate co-planar.

The third flow begins at 1232, where a first dielectric and first poly layer are formed over flash memory region to correspond to flash select gate. In 1234, a second dielectric, which is a charge trapping dielectric, is formed over the flash region on sidewalls of the select gate and over capacitor region. In 1236, the second poly layer is formed over the second dielectric to form a flash control gate and a bottom capacitor electrode. In 1238, a third dielectric is formed over the logic region and over the bottom capacitor electrode. In 1240, a third poly layer is formed over the third dielectric to form a logic gate and a top capacitor electrode. In 1242, an ILD is formed over the flash memory region, capacitor region, and logic region; and CMP is performed to make upper surfaces of select gate, top capacitor electrode, and logic gate co-planar.

FIGS. 13-16 depict a series of cross-sectional views that collectively depict several methods of manufacturing a semiconductor structure at various stages of manufacture. For clarity, FIGS. 13-16 are described in relation to the method 1200, however, it will be appreciated that the method 1200 is not limited to the structures disclosed in FIGS. 13-16.

Figure 13:
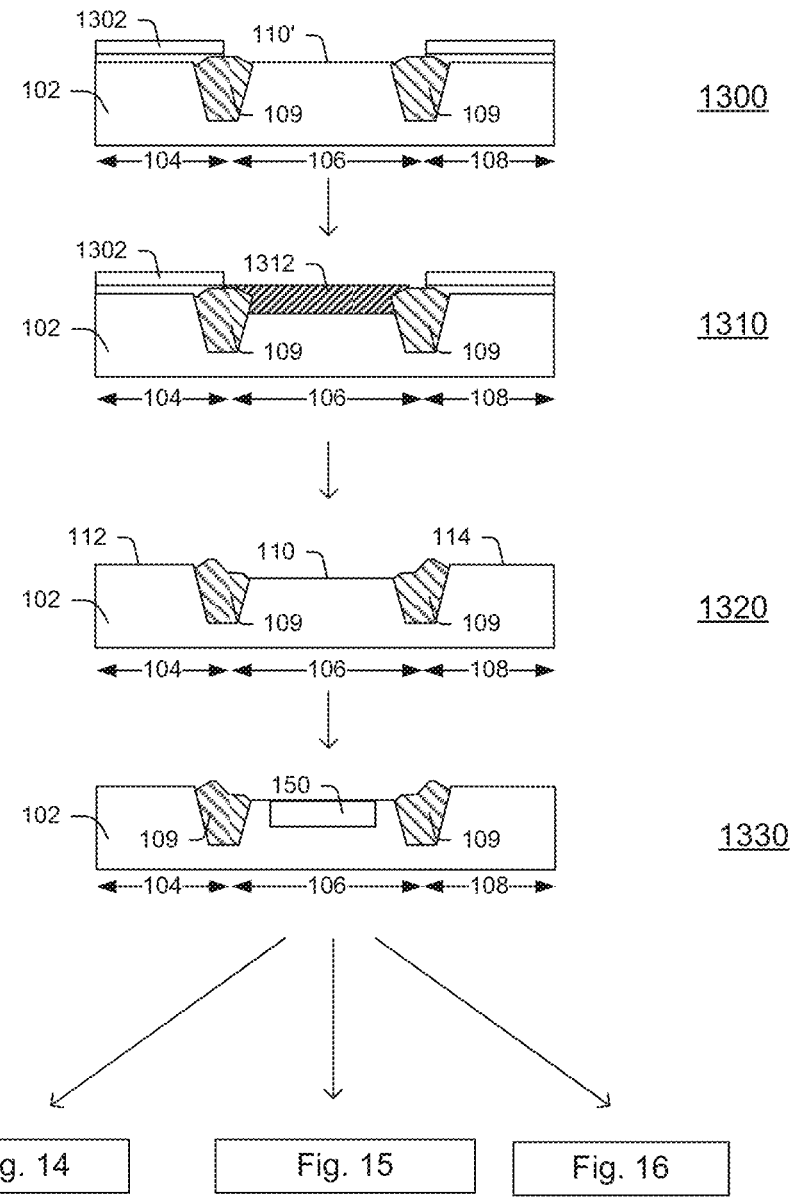
FIGS. 13-17 illustrate cross-sectional views that collectively depict several methods of forming an integrated circuit with embedded flash memory, PIP or PIM capacitors, and HKMG transistors thereon, in accordance with some embodiments.

FIG. 13 illustrates a series of cross-sectional views, which are consistent with some implementations of acts 1200-1204 of FIG. 12.

In act 1300 of FIG. 13, which is consistent with some implementations of act 1200 of FIG. 12, a semiconductor substrate 102 is provided. The substrate 102 includes a flash memory region 104, capacitor region 106, and logic region 108. STI regions 109 in the substrate isolate the flash memory region 104, capacitor region 106, and logic region 108 from one another. To form STI regions 109, a mask is formed over the substrate 102, and an etch is performed with the mask in place to form trench openings in the substrate 102. Dielectric material is then used to fill the trenches, and a SiN layer 1302 is deposited. The SiN layer 1302 is then patterned to expose the capacitor region 106 as illustrated. In some embodiments, the semiconductor substrate 102 can be a bulk silicon substrate or a semiconductor-on-insulator (SOI) substrate (e.g., silicon on insulator substrate). The semiconductor substrate 102 can also be a binary semiconductor substrate (e.g., GaAs), a tertiary semiconductor substrate (e.g., AlGaAs), or a higher order semiconductor substrate, for example. Any of these substrates can include doped regions formed in the substrate, one or more insulating layers formed in or on the substrate, and/or conducting layers formed in or on the substrate.

In acts 1310 and 1320 of FIG. 13, which are consistent with some implementations of act 1202 in FIG. 12, an upper substrate surface of the capacitor region (110) is recessed from an initial position 110' to the illustrated recessed position 110. This is achieved by carrying out an oxidation to form a thick oxidized region 1312 on upper substrate surface 110' within an opening in the SiN layer 1302. In 1320, the thick oxidized region 1312 and SiN layers are selectively removed, thereby leaving upper surface of capacitor region (110) recessed relative to respective upper substrate surfaces of the flash and logic regions (112, 114). In some embodiments, the etch may also leave divots or shoulders in the upper regions of the STI regions surrounding the capacitor region 106.

In act 1330 of FIG. 13, which is consistent with some implementations of act 1204 in FIG. 12, a doped region 150 is implanted in the substrate and is to act as a capacitor plate.

As shown at the bottom of FIG. 13, three different flows (i.e., a first flow in FIG. 14, a second flow in FIG. 15, and a third flow in FIG. 16) will now be described. Each of these flows can stem from 1330 of FIG. 13. As will be appreciated in more detail, these flows each use three different poly layers (e.g., a first, second, and third poly layer). The three poly layers can have the same compositions as one another or different compositions from one another. For example, two or more of the poly layers can have different doping types and/or concentrations, different conductivities, and/or different grain sizes from one another in some implementations. Each of these flows also uses three different dielectric layers (e.g., a flash gate dielectric, a charge trapping dielectric, and a high-κ dielectric). The polysilicon layers and dielectrics can manifest in different structural arrangements, each providing different tradeoffs in terms of performance and ease of manufacturing.

Figure 14:
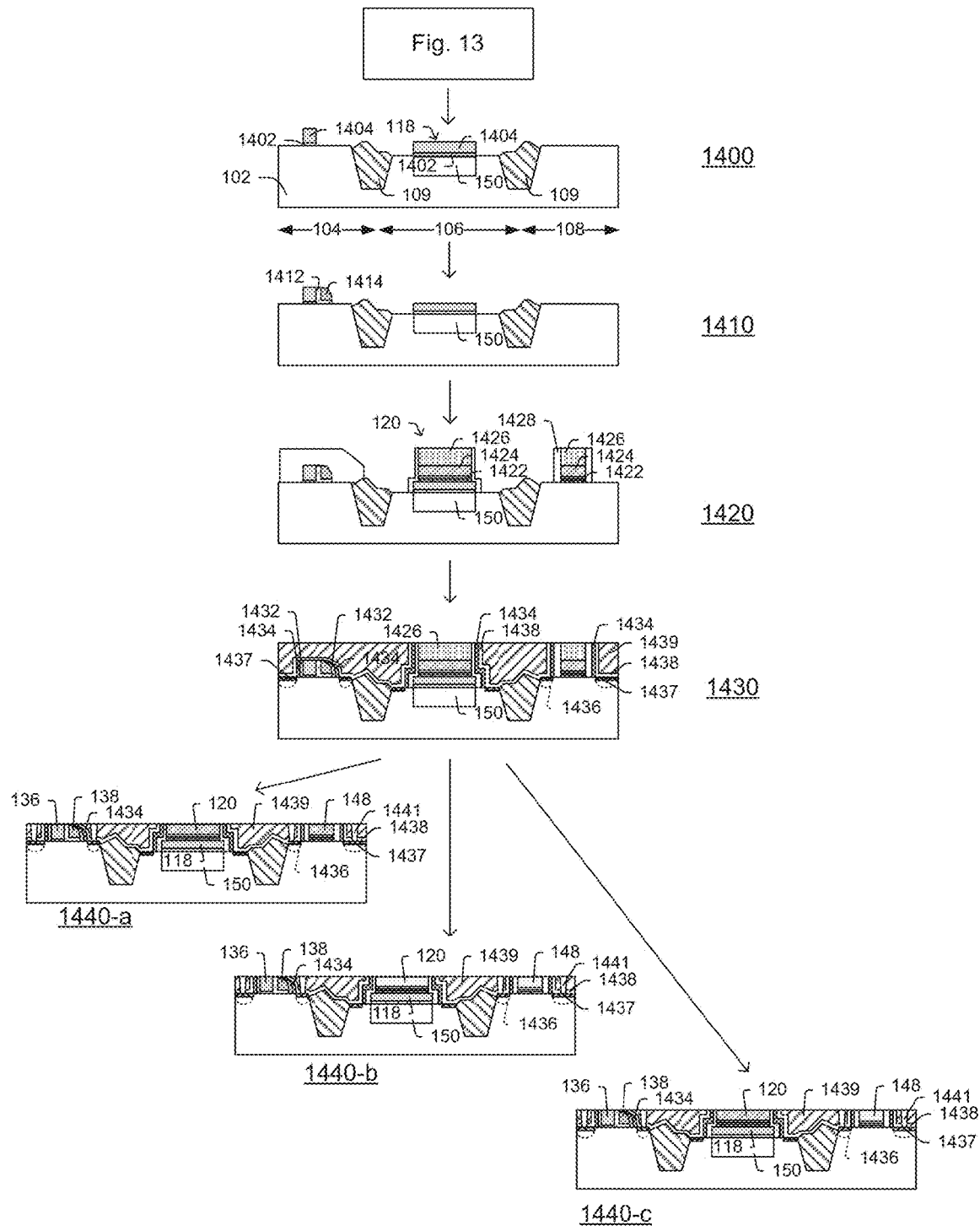

FIG. 14 is consistent with some implementations of acts 1208 through 1218 in FIG. 12. In 1400 of FIG. 14, which is consistent with some implementations of act 1208 in FIG. 12, a first dielectric layer 1402 is formed over the flash memory region and over the capacitor region. In some embodiments, this first dielectric layer 1402 is silicon dioxide formed by furnace oxidation or by deposition (e.g., PVD, CVD, PE-CVD, ALD), but could also be other types of dielectric material formed by other techniques. A first polysilicon layer 1404 is then formed over the first dielectric layer. After the first dielectric layer 1402 and first poly layer 1404 are formed, a mask, such as a photoresist mask, is then formed over first poly layer 1404 and an etch is carried out to selectively remove portions of these layers exposed through openings in the mask. In this way, a select gate structure 1404 and bottom capacitor electrode 118 are formed.

In 1410 of FIG. 14, which is consistent with some implementations of acts 1210-1212 in FIG. 12, a second dielectric layer 1412 is formed over the flash memory region and along sidewalls of the control gate. In some embodiments, this second dielectric layer 1412 is a charge trapping layer. The second dielectric layer 1412 can manifest as an oxide-nitride-oxide (ONO) structure, whereby a first oxide layer abuts the sidewall of the control gate and an upper substrate surface in the flash region, a nitride layer overlies the first oxide layer, and a second nitride layer overlies the nitride layer. Alternatively, the second dielectric layer 1412 can include a layer of silicon dots sandwiched between upper and lower $SiO_2$ layers. A second polysilicon layer 1414 is then formed over the second dielectric layer. The second dielectric layer 1412 and second poly layer 1414 are often conformal layers, and an etch back (e.g., anisotropic or vertical etch) is then performed to establish a control gate structure 1414 on an outer sidewall of the select gate 1404.

In 1420 of FIG. 14, which is consistent with some implementations of acts 1214-1216 in FIG. 12, a third dielectric layer 1422 is formed over the logic region and over the bottom capacitor electrode. In some embodiments, this third dielectric layer 1422 includes a high-κ dielectric layer. A third polysilicon layer 1424 is then formed over the third dielectric layer 1422, and a hardmask layer 1426 is formed over the third polysilicon layer. After the third dielectric and third poly layers are formed, a mask, such as a photoresist mask, is then formed over hardmask and an etch is carried out to remove portions of the third dielectric and third poly layers exposed through openings in the mask. In this way, a top capacitor electrode 120 and logic gate electrode are formed. After this etch is performed, first sidewall spacers 1428 can be formed on sidewalls of the logic gate electrode and on sidewalls of the capacitor electrode. Lightly doped drain (LDD) regions are formed after the first sidewall spacers 1428.

In 1430 of FIG. 14, which is consistent with some implementations of act 1218 in FIG. 12, second sidewall spacers 1432 are formed on sidewalls of the flash memory structure, after which third sidewall spacers 1434 are formed on sidewalls of the flash memory structure, capacitor structure, and logic gate. After the second and third sidewall spacers 1432, 1434 are formed, source/drain regions (e.g., 1436) can be formed by carrying out one or more ion implantations. A silicide layer 1437 is then formed over the structure source/drain regions and optionally on upper surfaces of the control gate and/or select gate structures to provide for ohmic contacts. A contact etch stop layer (CESL) 1438 is formed over the silicide, and an interlayer dielectric (ILD) 1439 is formed over the CESL 1438.

In 1440-*a* through 1440-*c* of FIG. 14, several options for additional processing are illustrated. In 1440-*a* of FIG. 14, chemical mechanical polishing (CMP) is performed to remove the hardmask 1426 and to make upper surfaces of select gate, top capacitor electrode, and logic gate co-planar. Thus, the structure of 1440-*a* FIG. 14 can correspond to FIG. 3, which includes a bottom capacitorelectrode 118 that is formed concurrently with and has the same composition as the select gate 136 of the flash memory (e.g., first poly layer); a first capacitor dielectric that is the same composition as the logic dielectric (e.g., high-κ dielectric); and a capacitor top electrode 120 that is formed concurrently with and has the same composition as the logic gate electrode 148 (e.g., third poly layer). After the CMP operation, a control gate and/or select gate silicide (not shown) is then formed on upper surfaces of the control gate and/or select gate. Contacts (e.g., 1441) extend down through the ILD 1439 and are ohmically coupled to source/drain regions 1436 through silicide 1437.

In 1440-*b* of FIG. 14, chemical mechanical polishing (CMP) is performed to remove the hardmask 1436 and to make upper surfaces of select gate, top capacitor electrode, and logic gate co-planar, but the polysilicon top capacitor 1424 and logic gate electrode 1434 are removed and replaced with a replacement metal gate, such as an aluminum metal gate for example. Thus, the structure of 1440-*b* FIG. 14 can correspond to FIG. 4, which includes a bottom capacitor electrode 118 that is formed concurrently with and has the same composition as the select gate 136 of the flash memory (e.g., first poly layer); a first capacitor dielectric that is the same composition as the logic dielectric (e.g., high-κ dielectric); and a capacitor top electrode 120 that is concurrently formed with and has the same composition as the logic gate electrode 148 (e.g., replacement aluminum metal gate).

In 1440-*c* of FIG. 14, chemical mechanical polishing (CMP) is performed to remove the hardmask and to make upper surfaces of select gate, top capacitor electrode, and logic gate co-planar, and the polysilicon top capacitor electrode is removed and replaced with a replacement polysilicon gate. The polysilicon logic gate electrode is removed and replaced with a replacement metal gate, such as an aluminum metal gate for example. Thus, the structure of 1440-*c* of FIG. 14 can correspond to FIG. 5, which includes a bottom capacitor electrode 118 that is formed concurrently and has the same composition as the select gate 136 of the flash memory (e.g., first poly layer); a first capacitor dielectric that is the same composition as the logic dielectric (e.g., high-κ dielectric); a replacement poly capacitor top electrode 120; and a replacement metal logic gate electrode 148.

Figure 15:
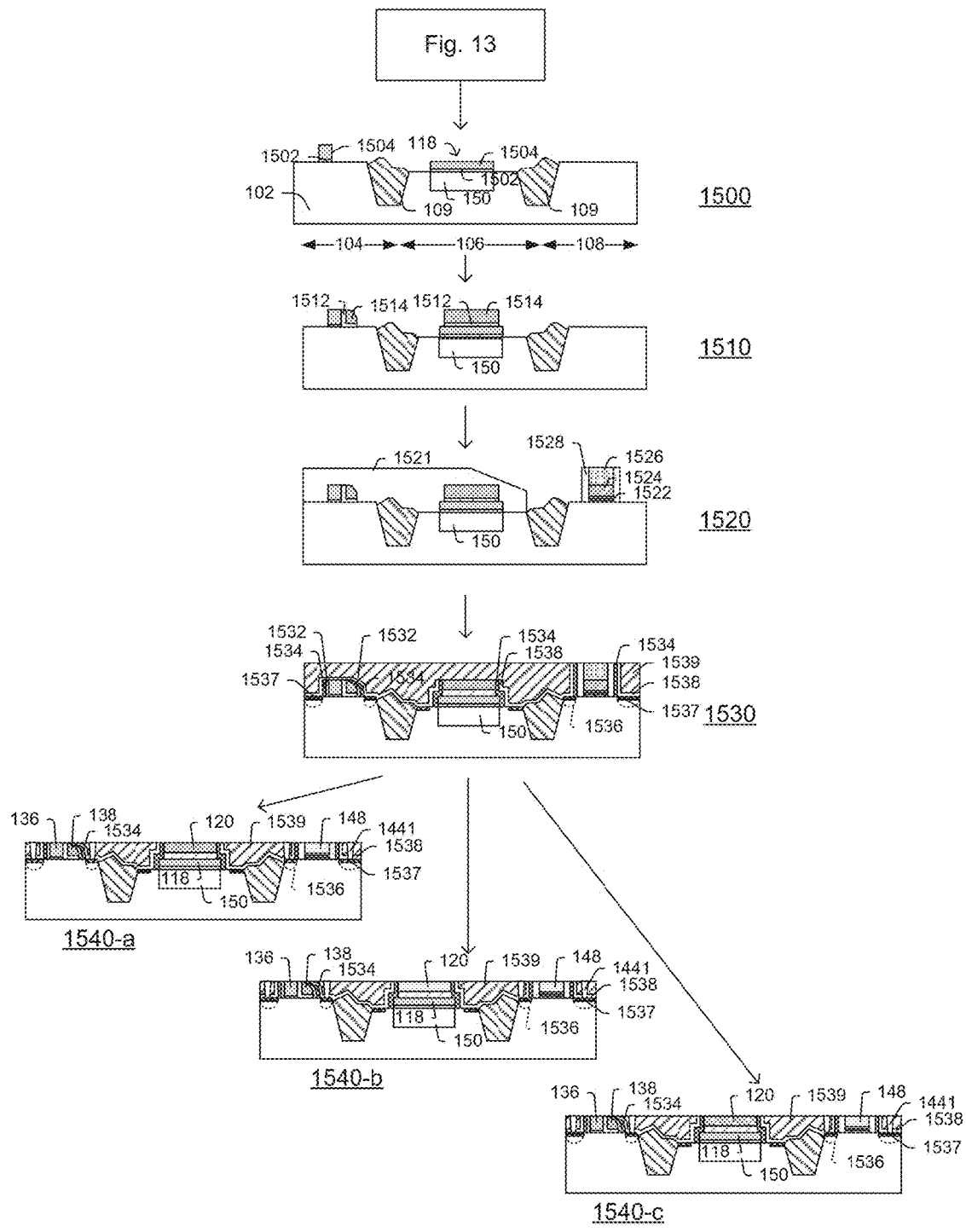

FIG. 15 is consistent with some implementations of acts 1220 through 1230 in FIG. 12. In 1500 of FIG. 15, which is consistent with some implementations of act 1220 in FIG. 12, a first dielectric layer 1502 is formed over the flash memory region 104 and over the capacitor region 106. In some embodiments, this first dielectric layer 1502 is silicon dioxide formed by furnace oxidation or by deposition (e.g., PVD, CVD, PE-CVD, ALD), but could also be other types of dielectric material formed by other techniques. A first polysilicon layer 1504 is then formed over the first dielectric layer 1502. After the first dielectric and first poly layers are formed, a mask, such as a photoresist mask, is then formed over first poly layer and an etch is carried out to selectively remove portions of these layers exposed through openings in the mask. In this way, a select gate structure (1504 over 104) and bottom capacitor electrode (1504 over 106) are formed.

In 1510 of FIG. 15, which is consistent with some implementations of acts 1222-1224 in FIG. 12, a second dielectric layer 1512 is formed over the flash memory region and along sidewalls of the select gate and is formed over the bottom capacitor electrode. In some embodiments, this second dielectric layer 1512 is a charge trapping layer. The second dielectric layer 1512 can manifest as an oxide-nitride-oxide (ONO) structure, whereby a first oxide layer abuts the sidewall of the control gate and an upper substrate surface in the flash region, a nitride layer overlies the first oxide layer, and a second nitride layer overlies the nitride layer. Alternatively, the second dielectric layer 1512 can include a layer of silicon dots sandwiched between upper and lower $SiO_2$ layers. A second polysilicon layer 1514 is then formed over the second dielectric layer 1512. The second dielectric layer 1512 and second poly layer 1514 are often conformal layers. A mask (not shown) is formed over the capacitor region, and an etch back (e.g., anisotropic or vertical etch) is then performed to establish a control gate structure on an outer sidewall of the select gate on the flash region 104 and a top electrode structure on the capacitor region 106.

In 1520 of FIG. 15, which is consistent with some implementations of acts 1226-1228 in FIG. 12, a mask 1521 is formed over the flash region and capacitor region, and a third dielectric layer 1522 is formed over the logic region. In some embodiments, this third dielectric layer 1522 is a high-κ dielectric layer. A third polysilicon layer 1524 is then formed over the third dielectric layer 1522, and a hardmask layer 1526 is formed over the third polysilicon layer 1524. After the third dielectric and third poly layers are formed, a mask, such as a photoresist mask (not shown), is then formed over hardmask 1526 and an etch is carried out to remove portions of the third dielectric and third poly layers exposed through openings in the mask. In this way, logic gate electrode is formed. After this etch is performed, first sidewall spacers 1528 such as nitride spacers, can be formed on sidewalls of the logic gate electrode. Lightly doped drain (LDD) regions are formed after the first sidewall spacers 1528.

In 1530 of FIG. 15, which is consistent with some implementations of act 1230 in FIG. 12, second sidewall spacers 1532 are formed on sidewalls of the flash memory structure, after which third sidewall spacers 1534 are formed on sidewalls of the flash memory structure, capacitor structure, and logic gate. After the second and third sidewall spacers 1532, 1534 are formed, source/drain regions (e.g., 1536) can be formed by carrying out one or more ion implantations. A silicide layer 1537 is then formed over the structure source/drain regions and optionally on upper surfaces of the control gate and/or select gate structures to provide for ohmic contacts. A contact etch stop layer (CESL) 1538 is formed over the silicide, and an interlayer dielectric (ILD) 1539 is formed over the CESL 1538.

In 1540-a through 1540-c of FIG. 15, several options for additional processing are illustrated. In 1540-a of FIG. 15, chemical mechanical polishing (CMP) is performed to remove the hardmask and to make upper surfaces of select gate, top capacitor electrode, and logic gate co-planar. After the CMP operation, a control gate and/or select gate silicide (not shown) is then formed on upper surfaces of the control gate and/or select gate. Thus, the structure of 1540-a of FIG. 15 can correspond to FIG. 6, which includes a bottom capacitor electrode 118 that is formed concurrently with and has the same composition as the select gate 136 of the flash memory (e.g., first poly layer); a capacitor dielectric that is a charge trapping layer used in flash; and a capacitor top electrode 120 that is formed concurrently with and has the same composition as the control gate electrode 138 (e.g., second poly layer). The logic gate electrode 148 can be a replacement metal gate, such as a replacement aluminum metal gate for example.

In 1540-b of FIG. 15, chemical mechanical polishing (CMP) is performed to remove the hardmask and to make upper surfaces of select gate, top capacitor electrode, and logic gate co-planar, but the polysilicon top capacitor and logic gate electrode are removed and replaced with a replacement metal gate, such as an aluminum metal gate for example. Thus, the structure of 1540-b of FIG. 15 can correspond to FIG. 7, which includes a bottom capacitor electrode 118 that is formed concurrently with and has the same composition as the select gate 136 of the flash memory (e.g., first poly layer); a first capacitor dielectric that is a charge trapping layer; and a capacitor top electrode 120 that is concurrently formed with and has the same composition as the logic gate electrode 148 (e.g., replacement aluminum metal gate).

In 1540-c of FIG. 15, chemical mechanical polishing (CMP) is performed to remove the hardmask and to make upper surfaces of select gate, top capacitor electrode, and logic gate co-planar, and the polysilicon top capacitor electrode is removed and replaced with a replacement polysilicon gate. The polysilicon logic gate electrode is removed and replaced with a replacement metal gate, such as an aluminum metal gate for example. Thus, the structure of 1540-c of FIG. 15 can correspond to FIG. 8, which includes a bottom capacitor electrode 118 that is formed concurrently and has the same composition as the select gate 136 of the flash memory (e.g., first poly layer); a control gate 138 made of a second poly layer; a first capacitor dielectric that is a charge trapping layer; a replacement poly capacitor top electrode 120; and a replacement metal logic gate electrode 148.

Figure 16:
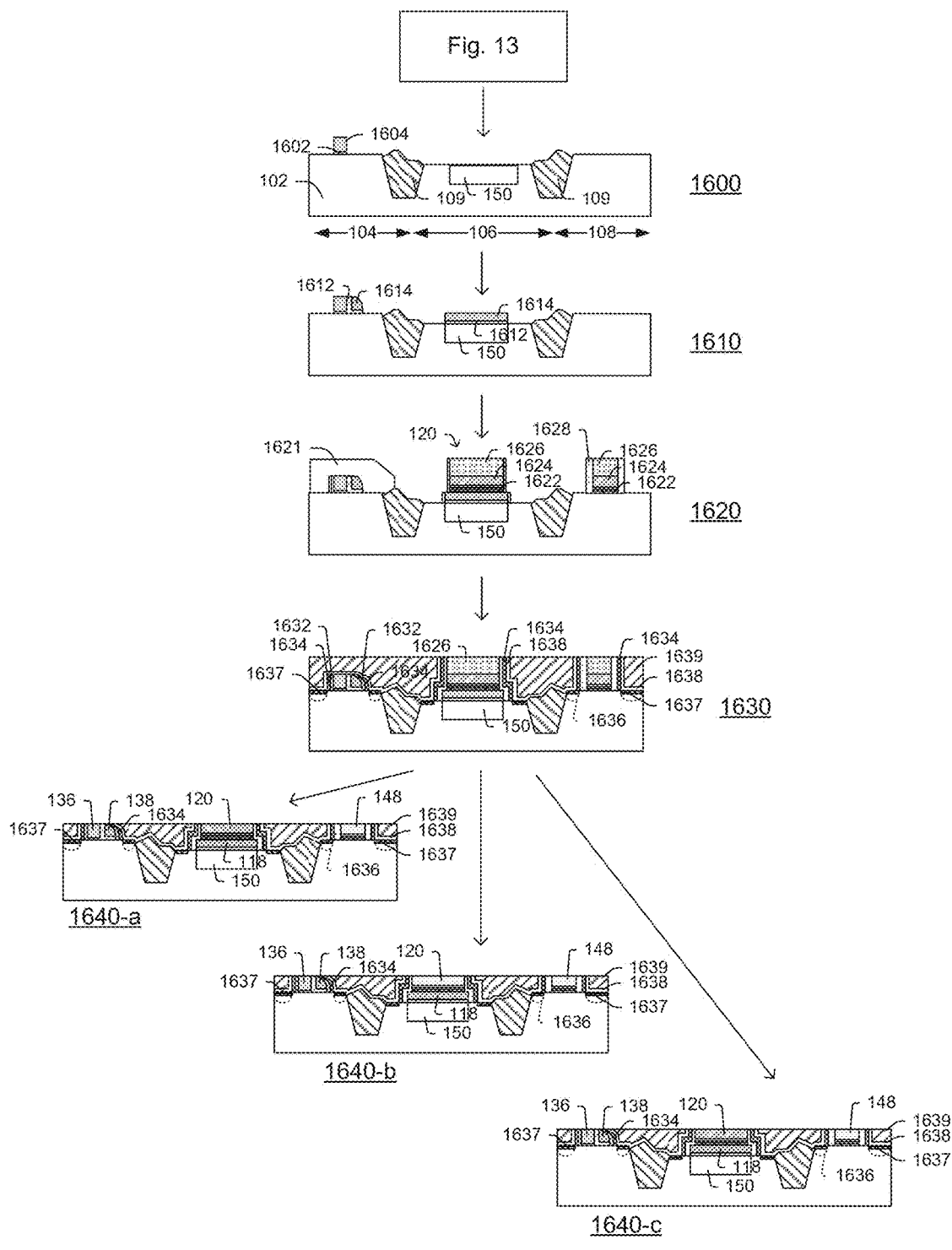

FIG. 16 is consistent with some implementations of acts 1232 through 1242 in FIG. 12. In 1600 of FIG. 16, which is consistent with some implementations of act 1232 in FIG. 12, a first dielectric layer 1602 is formed over the flash memory region. In some embodiments, this first dielectric layer 1602 is silicon dioxide formed by furnace oxidation or by deposition (e.g., PVD, CVD, PE-CVD, ALD), but could also be other types of dielectric material formed by other techniques. A first polysilicon layer 1604 is then formed over the first dielectric layer 1602. After the first dielectric and first poly layers are formed, a mask, such as a photoresist mask (not shown), is then formed over first poly layer 1604 and an etch is carried out to selectively remove portions of these layers exposed through openings in the mask. In this way, a select gate structure (1604) is formed.

In 1610 of FIG. 16, which is consistent with some implementations of acts 1234-1236 in FIG. 12, a second dielectric layer 1612 is formed over the flash memory region and along sidewalls of the select gate. In some embodiments, this second dielectric layer 1612 is a charge trapping layer. The second dielectric layer 1612 can manifest as an oxide-nitride-oxide (ONO) structure, whereby a first oxide layer abuts the sidewall of the control gate and an upper substrate surface in the flash region, a nitride layer overlies the first oxide layer, and a second nitride layer overlies the nitride layer. Alternatively, the second dielectric layer 1612 can include a layer of silicon dots sandwiched between upper and lower $SiO_2$ layers. A second polysilicon layer 1614 is then formed over the second dielectric layer 1612. The second dielectric layer 1612 and second poly layer 1614 are often conformal layers when formed. A mask (not shown) is formed over the capacitor region, and an etch back (e.g., anisotropic or vertical etch) is then performed to establish a control gate structure on an outer sidewall of the select gate and a top electrode structure on the capacitor region.

In 1620 of FIG. 16, which is consistent with some implementations of acts 1238-1240 in FIG. 12, a mask 1621 is formed over the flash region, and a third dielectric layer 1622 is formed over the logic region and bottom capacitor electrode. In some embodiments, this third dielectric layer 1622 is a high-κ dielectric layer. A third polysilicon layer 1624 is then formed over the third dielectric layer 1622, and a hardmask layer 1626 is formed over the third polysilicon layer. After the third dielectric and third poly layers are formed, a mask (not shown), such as a photoresist mask, is then formed over hardmask 1626 and an etch is carried out to remove portions of the hardmask, third dielectric and third poly layers exposed through openings in the mask. In this way, logic gate electrode and top capacitor electrode are formed. After this etch is performed, sidewall spacers 1628 such as nitride spacers, can be formed. Lightly doped drain (LDD) regions are formed after the first sidewall spacers 1628.

In 1630 of FIG. 16, which is consistent with some implementations of act 1230 in FIG. 12, second sidewall spacers 1632 are formed on sidewalls of the flash memory structure, after which third sidewall spacers 1634 are formed on sidewalls of the flash memory structure, capacitor structure, and logic gate. After the second and third sidewall spacers 1632, 1634 are formed, source/drain regions (e.g., 1636) can be formed by carrying out one or more ion implantations. A silicide layer 1637 is then formed over the structure source/drain regions and optionally on upper surfaces of the control gate and/or select gate structures to provide for ohmic contacts. A contact etch stop layer (CESL) 1638 is formed over the silicide, and an interlayer dielectric (ILD) 1639 is formed over the CESL 1638.

In 1640-a through 1640-c of FIG. 16, several options for additional processing are illustrated. In 1640-a of FIG. 16, chemical mechanical polishing (CMP) is performed to remove the hardmask and to make upper surfaces of select gate 136, top capacitor electrode 120, and logic gate 148 co-planar. After the CMP operation, a control gate and/or select gate silicide (not shown) is then formed on upper surfaces of the control gate and/or select gate. Thus, the structure of 1640-a of FIG. 16 can correspond to FIG. 9, which includes a select gate 136 made of a first poly layer; a bottom capacitor electrode 118 that is formed concurrently with and has the same composition as the control gate 138 of the flash memory (e.g., second poly layer); a first capacitor dielectric that is formed concurrently with and has the same composition as that of the logic transistor; and a capacitor top electrode 120 that is polysilicon (e.g., third poly layer). Logic gate 148 can be a replacement metal gate.

In 1640-b of FIG. 16, chemical mechanical polishing (CMP) is performed to remove the hardmask and to make upper surfaces of select gate, top capacitor electrode, and logic gate co-planar, but the polysilicon top capacitor and logic gate electrode are removed and replaced with a replacement metal gate, such as an aluminum metal gate for example. Thus, the structure of 1640-b of FIG. 16 can correspond to FIG. 10, which includes a select gate 136 made of a first poly layer; a bottom capacitor electrode 118 that is formed concurrently with and has the same composition as the control gate 138 of the flash memory (e.g., second poly layer); a capacitor dielectric that is formed concurrently with and has the same composition as the logic transistor; and a first capacitor top electrode 120 that is concurrently formed with and has the same composition as the logic gate electrode 148 (e.g., replacement aluminum metal gate).

In 1640-c of FIG. 16, chemical mechanical polishing (CMP) is performed to remove the hardmask and to make upper surfaces of select gate, top capacitor electrode, and logic gate co-planar, and the polysilicon top capacitor electrode is removed and replaced with a replacement polysilicon gate. The polysilicon logic gate electrode is removed and replaced with a replacement metal gate, such as an aluminum metal gate for example. Thus, the structure of 1640-c of FIG. 16 can correspond to FIG. 11, which includes a select gate 136 made of a first poly layer; a bottom capacitor electrode 118 that is formed concurrently and has the same composition as the control gate 138 of the flash memory (e.g., second poly layer); a first capacitor dielectric that is formed concurrently with and has the same composition as the logic transistor; a replacement poly capacitor top electrode 120; and a replacement metal logic gate electrode 148.

Figure 17:
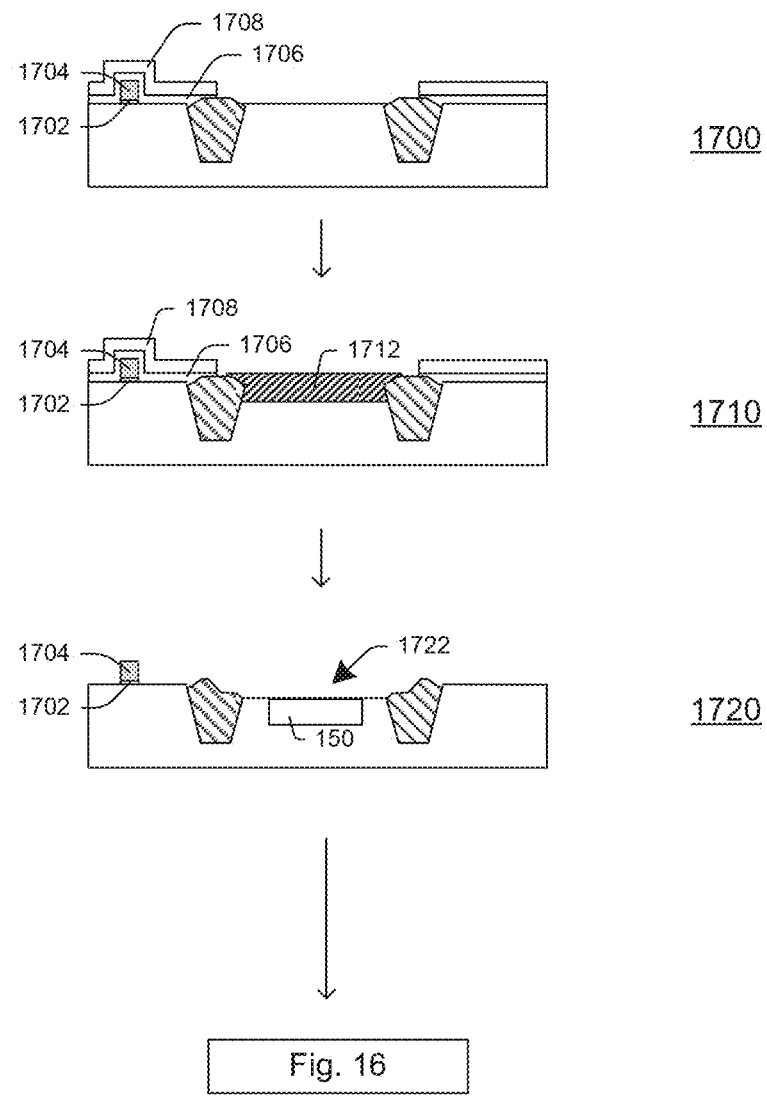

FIG. 17 shows an alternative technique for forming a recess in the capacitor region of the substrate. In this technique, in 1700, a first dielectric layer 1702 and first polysilicon layer 1704 are formed and patterned to correspond to the select gate of the flash memory cell. Next, a thin oxide layer 1706 and a SiN mask 1708 are then formed over the select gate structure. In 1710, a thick oxidation layer 1712 is then formed in the capacitor region. In 1720, the thick oxidation layer, thin oxide layer, and SiN mask are selectively removed, leaving a recess 1722 in the capacitor region. Optionally, a subsequent ion implantation process can subsequently be carried out to form doped capacitor region 150.

Accordingly, some embodiments of the present disclosure relate to an integrated circuit (IC) arranged on a semiconductor substrate, which includes a flash region, a capacitor region, and a logic region. An upper substrate surface of the capacitor region is recessed relative to respective upper substrate surfaces of the flash and logic regions, respectively. A capacitor, which includes a polysilicon bottom electrode, a conductive top electrode arranged over the polysilicon bottom electrode, and a first capacitor dielectric separating the bottom and top electrodes; is disposed over the recessed upper substrate surface of the capacitor region. A flash memory cell is disposed over the upper substrate surface of the flash region. The flash memory cell includes a select gate having a planarized upper surface that is co-planar with a planarized upper surface of the top electrode of the capacitor.

Other embodiments relate to an integrated circuit (IC). The IC is arranged on a semiconductor substrate, which includes a flash region, a capacitor region, and a logic region. An upper substrate surface of the capacitor region is recessed relative to respective upper substrate surfaces of the flash and logic regions, respectively. A first capacitor is disposed over the recessed upper substrate surface of the capacitor region. The first capacitor includes a polysilicon bottom electrode, a polysilicon or metal top electrode arranged over the polysilicon bottom electrode, and a first capacitor dielectric separating the bottom and top electrodes. A second capacitor is disposed over the recessed upper substrate surface of the capacitor region, and is stacked in parallel with the first capacitor. The second capacitor includes a doped region in the capacitor region of the semiconductor substrate, the polysilicon bottom electrode, and a second capacitor dielectric separating the doped region from the polysilicon bottom electrode.

Still other embodiments relate to a method. In this method, a semiconductor substrate, which includes a flash memory region, capacitor region, and logic region, is received. An upper substrate surface of the capacitor region is recessed relative to the flash memory region and logic region. A poly-insulator-poly (PIP) or poly-insulator-metal (PIM) capacitor is formed on the recessed upper substrate surface of the capacitor region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
a semiconductor substrate including a flash region, a capacitor region, and a logic region, wherein an upper substrate surface of the capacitor region is recessed relative to respective upper substrate surfaces of the flash and logic regions, respectively;
a capacitor disposed over the recessed upper substrate surface of the capacitor region, the capacitor including: a polysilicon bottom electrode, a conductive top electrode arranged over the polysilicon bottom electrode, and a first capacitor dielectric separating the bottom and top electrodes; and
a flash memory cell disposed over the upper substrate surface of the flash region, the flash memory cell including a select gate having a planarized upper surface that is co-planar with a planarized upper surface of the top electrode of the capacitor.

2. The IC of claim 1, further comprising:
a doped region of semiconductor substrate directly under the polysilicon bottom electrode; and
a second capacitor dielectric separating the doped region from the polysilicon bottom electrode;
wherein the doped region is ohmically coupled to the top electrode such that the doped region and top electrode collectively act as a capacitor plate of the capacitor.

3. The IC of claim 2, wherein the second capacitor dielectric differs from the first capacitor dielectric.

4. The IC of claim 1, further comprising:
a transistor disposed over the upper substrate surface of the logic region, the transistor including a metal gate having a planarized upper surface that is co-planar with both the planarized upper surface of the top electrode of the capacitor and the planarized upper surface of the select gate of the flash memory cell.

5. The IC of claim 4, wherein the conductive top electrode is a metal electrode made of the same material as the metal gate of the transistor.

6. The IC of claim 4, wherein the first capacitor dielectric is the same dielectric as a transistor gate dielectric which separates the metal gate of the transistor from the upper substrate surface of the logic region.

7. The IC of claim 1, wherein the conductive top electrode is a polysilicon electrode.

8. The IC of claim 1, wherein the first capacitor dielectric is a high-k dielectric which has a dielectric constant of greater than 3.9.

9. The IC of claim 1, wherein the flash memory cell comprises:
a polysilicon select gate arranged over a channel region of a first flash memory cell of a pair of split gate flash memory cells, wherein the polysilicon select gate is separated from the flash region of the substrate by a gate dielectric layer;
a polysilicon control gate arranged about an outer sidewall of the select gate; and
a charge trapping dielectric layer separating the control gate from the flash region of the substrate.

10. The IC of claim 9, wherein the charge trapping dielectric layer comprises:
a first oxide layer abutting an upper surface of the bottom electrode;
a nitride layer or layer of silicon dots abutting an upper surface of the first oxide layer; and
a second oxide layer abutting an upper surface of the nitride layer or layer of silicon dots, wherein the second oxide layer has an upper surface that abuts a corresponding lower surface of the top electrode.

11. The IC of claim 1, further comprising:
a shallow trench isolation (STI) region disposed within the semiconductor substrate and separating the capacitor region from the flash region, wherein an upper surface of the STI region extends to a first height above the upper substrate surface nearest the flash region and resides at a second height below the upper substrate surface nearest the capacitor region.

12. An integrated circuit (IC), comprising:
a semiconductor substrate including a flash region, a capacitor region, and a logic region, wherein an upper substrate surface of the capacitor region is recessed relative to respective upper substrate surfaces of the flash and logic regions, respectively;
a first capacitor disposed over the recessed upper substrate surface of the capacitor region, the first capacitor including: a polysilicon bottom electrode, a polysilicon or metal top electrode arranged over the polysilicon bottom electrode, and a first capacitor dielectric separating the bottom and top electrodes;
a second capacitor disposed over the recessed upper substrate surface of the capacitor region and stacked in parallel with the first capacitor, the second capacitor including: a doped region in the capacitor region of the semiconductor substrate, the polysilicon bottom electrode, and a second capacitor dielectric separating the doped region from the polysilicon bottom electrode; and
a flash memory cell disposed over the upper substrate surface of the flash region, the flash memory cell including a gate electrode having a planarized upper surface that is co-planar with a planarized upper surface of the top electrode of the first capacitor.

13. The IC of claim 12, further comprising:
a transistor disposed over the upper substrate surface of the logic region, the transistor including a metal gate having a planarized upper surface that is co-planar with the planarized upper surface of the top electrode of the first capacitor.

14. The IC of claim 13, wherein the first and second capacitor dielectrics are $SiO_2$ layers.

15. The IC of claim 13, wherein the first capacitor dielectric is a high-k dielectric layer and the second capacitor dielectric is an oxide layer or a charge-trapping layer.

16. The IC of claim 13, wherein the first capacitor dielectric is a charge trapping layer and the second capacitor dielectric is an oxide layer.

17. The IC of claim 13, wherein the upper substrate surfaces of the flash and logic regions are co-planar with one another.

18. A method, comprising:
receiving a semiconductor substrate that includes a flash memory region, capacitor region, and logic region;
recessing an upper substrate surface of the capacitor region relative to the flash memory region and logic region;

forming a poly-insulator-poly (PIP) or poly-insulator-metal (PIM) capacitor on the recessed upper substrate surface of the capacitor region;

forming a flash memory cell on the flash memory region;

forming a high-k metal gate (HKMG) transistor on the logic region; and performing a planarization to make an upper surface of a top electrode of the PIP or PIM capacitor co-planar with an upper surface of a gate electrode of the memory cell or with an upper surface of a gate electrode of the HKMG transistor.

19. The method of claim 18, wherein the flash memory cell includes a select gate, and performing the planarization makes the upper surface of the top electrode of the PIP or PIM capacitor co-planar with both the upper surface of the select gate and the upper surface of the gate electrode of the HKMG transistor.

20. The IC of claim 1, wherein the first capacitor dielectric has an uppermost surface which is positioned a first depth below the upper substrate surfaces of the flash and logic regions.

\* \* \* \* \*